(12) United States Patent
Li et al.

(10) Patent No.: US 12,217,650 B2
(45) Date of Patent: Feb. 4, 2025

(54) DRIVING CIRCUIT, DISPLAY SUBSTRATE AND DISPLAY DEVICE

(71) Applicants: CHENGDU BOE OPTOELECTRONICS TECHNOLOGY CO., LTD., Sichuan (CN); BOE Technology Group Co., Ltd., Beijing (CN)

(72) Inventors: Meng Li, Beijing (CN); Tianyi Cheng, Beijing (CN); Yao Huang, Beijing (CN)

(73) Assignees: CHENGDU BOE OPTOELECTRONICS TECHNOLOGY CO., LTD., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/778,376

(22) PCT Filed: Jun. 2, 2021

(86) PCT No.: PCT/CN2021/097860
§ 371 (c)(1),
(2) Date: May 19, 2022

(87) PCT Pub. No.: WO2022/252142
PCT Pub. Date: Dec. 8, 2022

(65) Prior Publication Data
US 2024/0221584 A1 Jul. 4, 2024

(51) Int. Cl.
*G09G 3/20* (2006.01)
(52) U.S. Cl.
CPC ... *G09G 3/2092* (2013.01); *G09G 2300/0426* (2013.01); *G09G 2300/0852* (2013.01);
(Continued)

(58) Field of Classification Search
CPC .. G09G 3/3225; G09G 3/3233; G09G 3/3266; G09G 3/3275; G09G 2300/0408;
(Continued)

(56) References Cited

U.S. PATENT DOCUMENTS

2011/0298771 A1 12/2011 Yoo et al.
2013/0049881 A1* 2/2013 Iida ...................... H03H 19/008
333/101

(Continued)

FOREIGN PATENT DOCUMENTS

CN 102270434 A 12/2011
CN 102855938 A 1/2013
(Continued)

*Primary Examiner* — Nelson M Rosario
(74) *Attorney, Agent, or Firm* — Intellectual Valley Law, P.C.

(57) ABSTRACT

A driving circuit includes an output circuit, a first node reset circuit and a second node control capacitor; the output circuit controls a driving signal terminal to output a driving signal under the control of a potential of a first node; the first node reset circuit controls to reset the first node under the control of a potential of a second node; the second node control capacitor is electrically connected to the second node; a width-to-length ratio of an output transistor included in the output circuit is less than or equal to a first predetermined width-to-length ratio; and/or a width-to-length ratio of a first node reset transistor included in the first node reset circuit is greater than or equal to a second predetermined width-to-length ratio; and/or, a capacitance value of the second node control capacitor is greater than or equal to a predetermined capacitance value.

17 Claims, 15 Drawing Sheets

(52) U.S. Cl.
CPC ........... *G09G 2310/0267* (2013.01); *G09G 2310/0275* (2013.01); *G09G 2310/061* (2013.01)

(58) Field of Classification Search
CPC ... G09G 2300/0426; G09G 2300/0819; G09G 2300/0842; G09G 2300/0861; G09G 2310/0286; G09G 3/32; G09G 3/36; G11C 19/28; H10K 59/12; H10K 59/1201; H10K 59/121; H10K 59/1216; H10K 59/124; H10K 59/126; H10K 59/131

See application file for complete search history.

(56) References Cited

U.S. PATENT DOCUMENTS

| | | | |
|---|---|---|---|
| 2014/0043304 | A1 | 2/2014 | Yamashita et al. |
| 2015/0294733 | A1 | 10/2015 | Tan et al. |
| 2018/0261164 | A1* | 9/2018 | Zhu ................ G11C 19/287 |
| 2021/0142709 | A1* | 5/2021 | Liu ..................... G09G 3/20 |
| 2021/0217361 | A1* | 7/2021 | Feng ................ G09G 3/3233 |
| 2021/0225279 | A1* | 7/2021 | Chen ................ G09G 3/3233 |
| 2022/0068212 | A1 | 3/2022 | Yao et al. |
| 2022/0223084 | A1* | 7/2022 | Lai ..................... G09G 3/20 |

FOREIGN PATENT DOCUMENTS

| | | |
|---|---|---|
| CN | 103440839 A | 12/2013 |
| CN | 103514843 A | 1/2014 |
| CN | 103578402 A | 2/2014 |
| CN | 103646636 A | 3/2014 |
| CN | 111816691 A | 10/2020 |
| CN | 112838109 A | 5/2021 |

* cited by examiner

DRIVING CIRCUIT, DISPLAY SUBSTRATE AND DISPLAY DEVICE

CROSS-REFERENCE TO RELATED APPLICATION

This application is a national stage application under 35 U.S.C. § 371 of International Application No. PCT/CN2021/097860, filed on Jun. 2, 2021, the contents of which are incorporated by reference in the entirety.

TECHNICAL FIELD

The present disclosure relates to the field of display technology, and more particularly to a driving circuit, a display substrate and a display device.

BACKGROUND

In the related art, when an N-type driving circuit (an N-type driving circuit refers to a driving circuit that outputs a valid driving signal of a high level) is in operation, the performance of the transistor and the storage capacitor do not match, the N-type driving circuit outputs abnormally, thereby resulting in an abnormal display.

SUMMARY

In a first aspect, a driving circuit includes an output circuit, a first node reset circuit and a second node control capacitor; the output circuit is configured to control a driving signal terminal to output a driving signal under the control of a potential of a first node; the first node reset circuit is configured to control to reset the first node under the control of a potential of a second node; the second node control capacitor is electrically connected to the second node; a width-to-length ratio of an output transistor included in the output circuit is less than or equal to a first predetermined width-to-length ratio; and/or a width-to-length ratio of a first node reset transistor included in the first node reset circuit is greater than or equal to a second predetermined width-to-length ratio; and/or, a capacitance value of the second node control capacitor is greater than or equal to a predetermined capacitance value; a range of the first predetermined width-to-length ratio is greater than or equal to 150/3.8 and less than or equal to 230/3.8, and a range of the second predetermined width-to-length ratio is greater than or equal to 4/4.9 and less than or equal to 6/4.9; a range of the predetermined capacitance value is greater than or equal to 143 fF and less than or equal to 243 fF.

Optionally, the first predetermined width-to-length ratio is 210/3.8, the second predetermined width-to-length ratio is 5/4.9, and the predetermined capacitance value is 243 fF.

Optionally, a control electrode of the output transistor is electrically connected to the first node, a first electrode of the output transistor is electrically connected to a first clock signal line, and a second electrode of the output transistor is electrically connected to the driving signal terminal; a control electrode of the first node reset transistor is electrically connected to the second node, a first electrode of the first node reset transistor is electrically connected to the first node, and a second electrode of the first node reset transistor is electrically connected to the first clock signal line.

Optionally, the driving circuit further comprises a third node control circuit, a fourth node control circuit, a fifth node control circuit, a second node control circuit, a first node control circuit, and an output reset circuit; the third node control circuit is respectively electrically connected to a second clock signal line, a first voltage line and a third node, and is configured to write a first voltage signal provided by the first voltage line into the third node under the control of a second clock signal provided by the second clock signal line; the fourth node control circuit is respectively electrically connected to a sixth node, a third clock signal line and a fourth node, and is configured to control the third clock signal line to write the third clock signal into the fourth node under the control of a potential of the sixth node, and control a potential of the fourth node according to the potential of the sixth node; the fifth node control circuit is electrically connected to the second clock signal line, the first clock signal line, an input terminal and a fifth node respectively, and is configured to control the input terminal to provide an input signal to the fifth node under the control of the second clock signal provided by the second clock signal line and the first clock signal provided by the first clock signal line; the second node control circuit is respectively electrically connected to a third node, a seventh node, a second voltage line, a second node and a third clock signal line, and is configured to control to connect the seventh node and the second voltage line under the control of a potential of the third node, and control to connect the seventh node and the third clock signal line under the control of the potential of the second node; a first electrode plate of the second node control capacitor is electrically connected to the seventh node, and a second electrode plate of the second node control capacitor is electrically connected to the second node; the first node control circuit is respectively electrically connected to the fourth node, the third clock signal line and the first node, and is configured to control to connect the fourth node and the first node under the control of the third clock signal provided by the third clock signal line; the output reset circuit is respectively electrically connected to the second node, the driving signal terminal and the first voltage line, and is configured to control to connect the driving signal terminal and the first voltage line under the control of the potential of the second node.

Optionally, the third node and the sixth node are a same node; or, the driving circuit further includes a first conduction control circuit; the first conduction control circuit is configured to control to connect the third node and the sixth node under the control of the first voltage signal provided by the first voltage line.

Optionally, the fifth node and the second node are a same node; or, the driving circuit further includes a second conduction control circuit; the second conduction control circuit is configured to control to connect the fifth node and the second node under the control of the first voltage signal provided by the first voltage line.

Optionally, the third node control circuit includes a first transistor and a second transistor; a control electrode of the first transistor is electrically connected to the second clock signal line, a first electrode of the first transistor is electrically connected to the first voltage line, and a second electrode of the first transistor is electrically connected to the third node; a control electrode of the second transistor is electrically connected to the fifth node, a first electrode of the second transistor is electrically connected to the second clock signal line, and a second electrode of the second transistor is electrically connected to the third node; the fourth node control circuit includes a third transistor and a first capacitor; a control electrode of the third transistor is electrically connected to the sixth node, a first electrode of the third transistor is electrically connected to the third clock signal line, and a second electrode of the third transistor is electrically connected to the fourth node; a first electrode plate of the first capacitor is electrically connected to the sixth node, and a second electrode plate of the first capacitor is electrically connected to the fourth node; the fifth node control circuit includes a fourth transistor and a fifth transistor; a control electrode of the fourth transistor is electrically connected to the first clock signal line, and a first electrode of the fourth transistor is electrically connected to the input end; a control electrode of the fifth transistor is electrically connected to the second clock signal line, a first electrode of the fifth transistor is electrically connected to a second electrode of the fourth transistor, and a second electrode of the fifth transistor is electrically connected electrically connected to the fifth node; the second node control circuit includes a sixth transistor and a seventh transistor; a control electrode of the sixth transistor is electrically connected to the third node, a first electrode of the sixth transistor is electrically connected to the second voltage line, and a second electrode of the sixth transistor is electrically connected to the seventh node; a control electrode of the seventh transistor is electrically connected to the second node, a first electrode of the seventh transistor is electrically connected to the third clock signal line, and a second electrode of the seventh transistor is electrically connected to the seventh node; the first node control circuit includes an eighth transistor and a second capacitor; a control electrode of the eighth transistor is electrically connected to the third clock signal line, a first electrode of the eighth transistor is electrically connected to the fourth node, and a second electrode of the eighth transistor is electrically connected to the first node; a first electrode plate of the second capacitor is electrically connected to the first node, and a second electrode plate of the second capacitor is electrically connected to the first clock signal line; the output reset circuit includes a ninth transistor; a control electrode of the ninth transistor is electrically connected to the second node, a first electrode of the ninth transistor is electrically connected to the first voltage line, and a second electrode of the ninth transistor is electrically connected to the driving signal terminal.

In a second aspect, a display substrate includes the driving circuit arranged on the substrate.

Optionally, the driving circuit comprises an output circuit; the output circuit comprises an output transistor; an active layer of the output transistor includes at least one first channel portion extending in a first direction; a sum of widths of the at least one first channel portion along the first direction is less than or equal to the first predetermined width, so that the width-to-length ratio of the output transistor is less than or equal to the first predetermined width-to-length ratio.

Optionally, the driving circuit comprises a first node reset circuit; the first node reset circuit comprises a first node reset transistor; an active layer of the first node reset transistor includes at least one second channel portion; a sum of widths of the at least one second channel portion along a second direction is greater than or equal to a second predetermined width, so that the width-to-length ratio of the first node reset transistor is greater than or equal to the second predetermined width-to-length ratio; the first direction and the second direction intersect.

Optionally, the display substrate further includes a gate line and a data line arranged in the display area; the gate line includes a portion extending in the first direction, and the data line includes a portion extending in the second direction.

Optionally, the driving circuit comprises a second node control capacitor; the second node control capacitor includes a first electrode plate and a second electrode plate arranged at different layers; the first electrode plate and the second electrode plate are provided with an insulating layer; an orthographic projection of the first electrode plate on the substrate at least partially overlaps an orthographic projection of the second electrode plate on the substrate, and an overlapping area between the orthographic projection of the first electrode plate on the substrate and the orthographic projection of the second electrode plates on the substrate is greater than or equal to a predetermined area, so that a capacitance value of the second node control capacitor is greater than or equal to the predetermined capacitance value.

In a third aspect, a display device includes the display substrate.

Optionally, the display device further includes a voltage supply circuit; the first voltage signal is a low voltage signal, and the second voltage signal is a high voltage signal; the voltage providing circuit is configured to provide the first voltage signal and the second voltage signal, and control a difference value between the second voltage value and the first voltage value to be greater than a predetermined difference value; the second voltage value is a voltage value of the second voltage signal, and the first voltage value is a voltage value of the first voltage signal; when a potential of a clock signal provided by each clock signal line included in the driving circuit in the display substrate is a low voltage, a voltage value of the clock signal is the first voltage value; when the potential of the clock signal provided by each clock signal line is a high voltage, the voltage value of the clock signal is the second voltage value.

DETAILED DESCRIPTION

Figure 1:
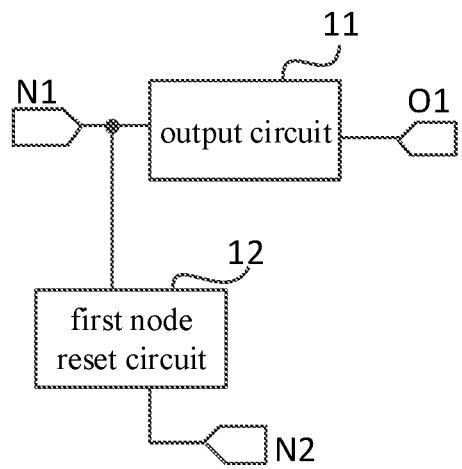
FIG. 1 is a structural diagram of a driving circuit according to an embodiment of the present disclosure.

The technical solutions in the embodiments of the present disclosure will be clearly and completely described below with reference to the accompanying drawings in the embodiments of the present disclosure. Obviously, the described embodiments are only a part of the embodiments of the present disclosure, but not all of the embodiments. Based on the embodiments in the present disclosure, all other embodiments obtained by those of ordinary skill in the art without creative work shall fall within the protection scope of the present disclosure.

The transistors used in all the embodiments of the present disclosure may be triodes, thin film transistors, field effect transistors, or other devices with the same characteristics. In the embodiments of the present disclosure, in order to distinguish the two electrodes of the transistor other than the control electrode, one electrode is called the first electrode, and the other electrode is called the second electrode.

In actual operation, when the transistor is a triode, the control electrode may be the base, the first electrode may be the collector, and the second electrode may be the emitter; or the control electrode may be the base, the first electrode can be the emitter, and the second electrode can be the collector.

In actual operation, when the transistor is a thin film transistor or a field effect transistor, the control electrode may be a gate electrode, the first electrode may be a drain electrode, and the second electrode may be a source electrode; or the control electrode may be a gate electrode, the first electrode may be a source electrode, and the second electrode may be a drain electrode.

The driving circuit described in the embodiment of the present disclosure includes an output circuit, a first node reset circuit, and a second node control capacitor;

The output circuit is configured to control a driving signal terminal to output a driving signal under the control of a potential of a first node;

The first node reset circuit is configured to control to reset the first node under the control of a potential of a second node;

the second node control capacitor is electrically connected to the second node;

A width-to-length ratio of an output transistor included in the output circuit is less than or equal to a first predetermined width-to-length ratio; and/or a width-to-length ratio of a first node reset transistor included in the first node reset circuit is greater than or equal to a second predetermined width-to-length ratio; and/or, the capacitance value of the second node control capacitor is greater than or equal to a predetermined capacitance value;

A range of the first predetermined width-to-length ratio is greater than or equal to 150/3.8 and less than or equal to 230/3.8, and a range of the second predetermined width-to-length ratio is greater than or equal to 4/4.9 and less than or equal to 6/4.9; a range of the predetermined capacitance value is greater than or equal to 143 fF and less than or equal to 243 fF.

The driving circuit described in the embodiment of the present disclosure controls the width-to-length ratio of the output transistor to be less than or equal to the first predetermined width-to-length ratio, and/or controls the width-to-length ratio of the first node reset transistor to be greater than or equal to the second predetermined width-to-length ratio, and/or controls the capacitance value of the second node control capacitor to be greater than or equal to the predetermined capacitance value through optimized design, so that the waveform of the driving signal outputted by the driving circuit is normal.

In this embodiment of the present disclosure, at least one of the following needs to be satisfied:

The width-to-length ratio of the output transistor included in the output circuit is less than or equal to the first predetermined width-to-length ratio;

The width-to-length ratio of the first node reset transistor included in the first node reset circuit is greater than or equal to the second predetermined width-to-length ratio;

The capacitance value of the second node control capacitance is greater than or equal to the predetermined capacitance value.

That is, in at least one embodiment of the present disclosure,

The width-to-length ratio of the output transistor included in the output circuit is less than or equal to the first predetermined width-to-length ratio; or, The width-to-length ratio of the first node reset transistor included in the first node reset circuit is greater than or equal to the second predetermined width-to-length ratio; or, The capacitance value of the second node control capacitor is greater than or equal to the predetermined capacitance value; or, The width-to-length ratio of the output transistor included in the output circuit is less than or equal to the first predetermined width-to-length ratio; the width-to-length ratio of the first node reset transistor included in the first node reset circuit is greater than or equal to the second predetermined width-to-length ratio; or, The width-to-length ratio of the first node reset transistor included in the first node reset circuit is greater than or equal to the second predetermined width-to-length ratio; the capacitance value of the second node control capacitor is greater than or equal to a predetermined capacitance value; or, The width-to-length ratio of the output transistor included in the output circuit is less than or equal to the first predetermined width-to-length ratio; the capacitance value of the second node control capacitor is greater than or equal to the predetermined capacitance value; or, The width-to-length ratio of the output transistor included in the output circuit is less than or equal to the first predetermined width-to-length ratio; the width-to-length ratio of the first node reset transistor included in the first node reset circuit is greater than or equal to the second predetermined width-to-length ratio; the capacitance value of the second node control capacitor is greater than or equal to the predetermined capacitance value.

As shown in FIG. 1, the driving circuit according to the embodiment of the present disclosure includes an output circuit 11 and a first node reset circuit 12;

The output circuit 11 is electrically connected to N1 and the driving signal terminal O1 respectively, and is configured to control the driving signal terminal O1 to output a driving signal under the control of the potential of the first node N1;

The first node reset circuit 12 is electrically connected to the second node N2 and the first node N1 respectively, and is configured to control to reset the first node N1 under the control of the potential of the second node N2;

The width-to-length ratio of the output transistor included in the output circuit 11 is less than or equal to the first predetermined width-to-length ratio; and/or the width-to-length ratio of the first node reset transistor included in the first node reset circuit 12 is greater than or equal to the second predetermined width-to-length ratio.

The driving circuit described in the embodiment of the present disclosure controls the width-to-length ratio of the output transistor to be less than or equal to the first predetermined width-to-length ratio, and/or controls the width-to-length ratio of the first node reset transistor to be greater than or equal to the second predetermined width-to-length ratio through optimized design, so that the waveform of the driving signal outputted by the driving circuit is normal.

In at least one embodiment of the present disclosure, the driving circuit may be a gate driving circuit or a light emitting control signal generation circuit, but not limited thereto.

In at least one embodiment of the present disclosure, the range of the first predetermined width-to-length ratio may be greater than or equal to 150/3.8 and less than or equal to 230/3.8, and the range of the second predetermined width-to-length ratio may be is greater than or equal to 4/4.9 and less than or equal to 6/4.9.

Optionally, the first predetermined width-to-length ratio is 210/3.8, and the second predetermined width-to-length ratio is 5/4.9, but not limited thereto.

In at least one embodiment of the present disclosure, by setting the width-to-length ratio of the output transistor to be smaller, the inter-electrode capacitance of the output transistor is reduced, so that the response time of the output transistor is fast, and the output transistor can be turned on or off quickly;

The width-to-length ratio of the first node reset transistor is set to be large, so that there are more instantaneous carriers in the first node reset transistor, the voltage response speed is fast, and the output transistor can be instantly controlled to be turned on or off.

Figure 2:
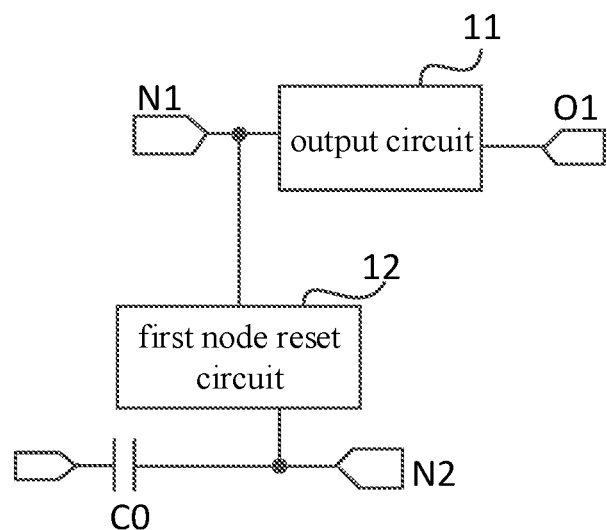
FIG. 2 is a structural diagram of a driving circuit according to at least one embodiment of the present disclosure.

As shown in FIG. 2, based on the embodiment of the driving circuit shown in FIG. 1, the driving circuit according to at least one embodiment of the present disclosure may further include a second node control capacitor C0;

The second node control capacitor C0 is electrically connected to the second node N2, and a capacitance value of the second node control capacitor C0 is greater than or equal to a predetermined capacitance value, so that the waveform of the driving signal outputted by the driving circuit is normal.

In at least one embodiment of the present disclosure, the range of the predetermined capacitance value may be greater than or equal to 143 fF and less than or equal to 243 fF.

Optionally, the predetermined capacitance value is 243 fF, but not limited thereto.

In at least one embodiment of the present disclosure, the optimal combination of the width-to-length ratio of the output transistor, the width-to-length ratio of the first node reset transistor, and the capacitance value of the second node control capacitor may be that: the width-length ratio of the output transistor is 210/3.8, the width-length ratio of the first node reset transistor is 6/4.9, and the capacitance value of the second node control capacitor is 243 fF.

In at least one embodiment of the present disclosure, the control electrode of the output transistor is electrically connected to the first node, the first electrode of the output transistor is electrically connected to the first clock signal line, and the second electrode of the output transistor is electrically connected to the driving signal terminal;

The control electrode of the first node reset transistor is electrically connected to the second node, the first electrode of the first node reset transistor is electrically connected to the first node, and the second electrode of the first node reset transistor is electrically connected to the first clock signal line.

The driving circuit according to at least one embodiment of the present disclosure may further include a third node control circuit, a fourth node control circuit, a fifth node control circuit, a second node control circuit, a first node control circuit, and an output reset circuit;

The third node control circuit is respectively electrically connected to the second clock signal line, the first voltage line and the third node, and is configured to write the first voltage signal provided by the first voltage line into the third node under the control of the second clock signal provided by the second clock signal line;

The fourth node control circuit is respectively electrically connected to the sixth node, the third clock signal line and the fourth node, and is configured to control the third clock signal line to write the third clock signal into the fourth node under the control of the potential of the sixth node, and control the potential of the fourth node according to the potential of the sixth node;

The fifth node control circuit is electrically connected to the second clock signal line, the first clock signal line, the input terminal and the fifth node respectively, and is configured to control the input terminal to provide the input signal to the fifth node under the control of the second clock signal provided by the second clock signal line and the first clock signal provided by the first clock signal line;

The second node control circuit is respectively electrically connected to the third node, the seventh node, the second voltage line, the second node N2 and the third clock signal line, and is configured to control to connect the seventh node and the second voltage line under the control of the potential of the third node, and control to connect the seventh node and the third clock signal line under the control of the potential of the second node;

The first electrode plate of the second node control capacitor is electrically connected to the seventh node, and the second electrode plate of the second node control capacitor is electrically connected to the second node;

The first node control circuit is respectively electrically connected to the fourth node, the third clock signal line and the first node, and is configured to control to connect the fourth node and the first node under the control of the third clock signal provided by the third clock signal line;

The output reset circuit is respectively electrically connected to the second node, the driving signal terminal and the first voltage line, and is configured to control to connect the driving signal terminal and the first voltage line under the control of the potential of the second node.

Optionally, the third node and the sixth node are the same node; or,

The driving circuit further includes a first conduction control circuit; the first conduction control circuit is used to control to connect the third node and the sixth node under the control of the first voltage signal provided by the first voltage line.

Optionally, the fifth node and the second node are the same node; or,

The driving circuit further includes a second conduction control circuit; the second conduction control circuit is used to control to connect the fifth node and the second node under the control of the first voltage signal provided by the first voltage line.

Figure 3:
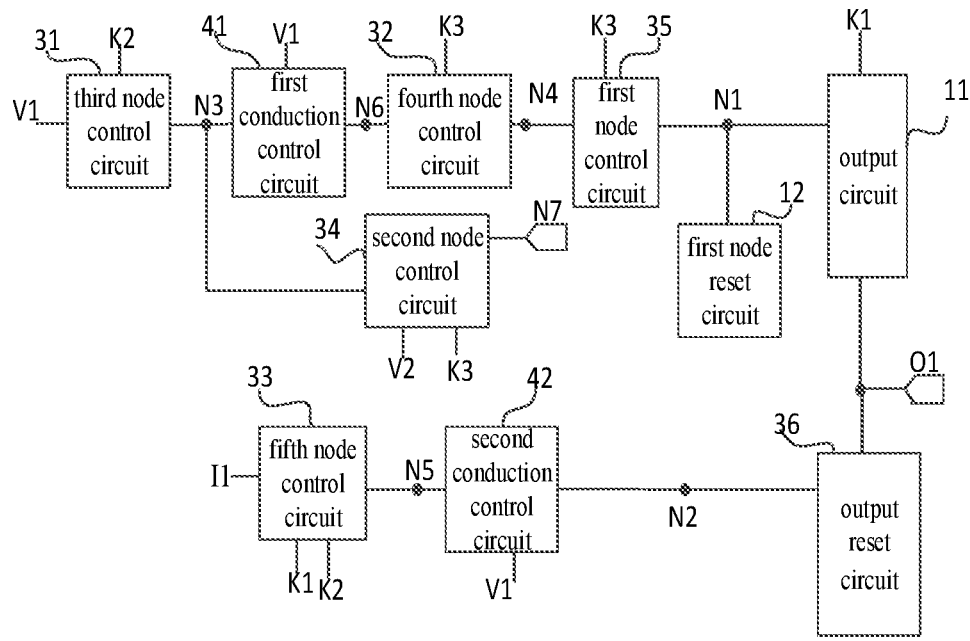
FIG. 3 is a structural diagram of a driving circuit according to at least one embodiment of the present disclosure.

As shown in FIG. 3, on the basis of the embodiment of the driving circuit shown in FIG. 2, the driving circuit according to at least one embodiment of the present disclosure further includes a third node control circuit 31, a fourth node control circuit 32, a fifth node control circuit 33, a second node control circuit 34, a first node control circuit 35, an output reset circuit 36, a first conduction control circuit 41 and a second conduction control circuit 42;

The output circuit 11 is also electrically connected to the first clock signal line K1, is configured to control the first clock signal line K1 to provide a first clock signal to the driving signal terminal under the control of the potential of the first node N1;

The first node reset circuit 12 is also electrically connected to the first clock signal line K1, and is configured to control to connect the first node N1 and the first clock signal line K1 under the control of the potential of the second node N2;

The third node control circuit 31 is respectively electrically connected to the second clock signal line K2, the first voltage line V1 and the third node N3, and is configured to control to write the first voltage signal provided by the first voltage line V1 into the third node N3 under the control of the second clock signal provided by the second clock signal line K2;

The fourth node control circuit 32 is electrically connected to the sixth node N6, the third clock signal line K3 and the fourth node N4, respectively, and is configured to control the third clock signal line K3 to write the third clock signal into the fourth node N4 under the control of the potential of the sixth node N6, and controls the potential of the fourth node N4 according to the potential of the sixth node N6;

The fifth node control circuit 33 is respectively electrically connected to the second clock signal line K2, the first clock signal line K1, the input terminal I1 and the fifth node N5, and is configured to the input terminal I1 to provide the input signal to the fifth node N5 under the control of the second clock signal provided by the second clock signal line K2 and the first clock signal provided by the first clock signal line K1;

The second node control circuit 34 is electrically connected to the third node N3, the seventh node N7, the second voltage line V2, the second node N2 and the third clock signal line K3, respectively, and is configured to control to connect the seventh node N7 and the second voltage line V2 under the control the potential of the third node N3, and control to connect the seventh node N7 and the third clock signal line K3 under the control of the potential of the second node N2;

The first electrode plate of the second node control capacitor C0 is electrically connected to the seventh node N7, and the second electrode plate of the second node control capacitor is electrically connected to the second node N2;

The first node control circuit 35 is electrically connected to the fourth node N4, the third clock signal line K3 and the first node N1, respectively, and is configured to control to connect the fourth node N4 and the first node N1 under the control of the third clock signal provided by the third clock signal line K3;

The output reset circuit 36 is electrically connected to the second node N2, the driving signal terminal O1 and the first voltage line V1 respectively, and is configured to control to connect the driving signal terminal O1 and the first voltage line V1 under the control of the potential of the second node N2;

The first conduction control circuit 41 is electrically connected to the first voltage line V1, the third node N3 and the sixth node N6 respectively, and is configured to control to connect the third node N3 and the sixth node N6 under the control of the first voltage signal provided by the first voltage line V1;

The second conduction control circuit 42 is electrically connected to the first voltage line V1, the fifth node N5 and the second node N2 respectively, and is configured to control to connect the fifth node N5 and the second node N2 under the control of the first voltage signal provided by the first voltage line V1.

During operation of at least one embodiment of the driving circuit shown in FIG. 3 of the present disclosure, the fifth node control circuit 33 controls the potential of the fifth node N5, and the third node control circuit 31 controls the potential of the third node N3, the second node control circuit 34 controls the potential of the second node N2, the fourth node control circuit 32 controls the potential of the fourth node N4, the first node control circuit 35 controls the potential of the first node N1, the first node reset circuit 12 controls the potential of the first node N1 under the control of the potential of the second node N2; the output circuit 11 controls the driving signal terminal O1 to output the first clock signal under the control of the potential of the first node N1; the output reset circuit 36 controls the driving signal terminal O1 to output the first voltage signal under the control of the potential of the second node N2.

In the driving circuit shown in FIG. 3 of the present disclosure, a first conduction control circuit 41 is provided between the third node N3 and the sixth node N6, and a second conduction control circuit 42 is provided between the fifth node N5 and the second node N2.

In at least one embodiment of the present disclosure, the third node control circuit includes a first transistor and a second transistor;

The control electrode of the first transistor is electrically connected to the second clock signal line, the first electrode of the first transistor is electrically connected to the first voltage line, and the second electrode of the first transistor is electrically connected to the third node;

The control electrode of the second transistor is electrically connected to the fifth node, the first electrode of the second transistor is electrically connected to the second clock signal line, and the second electrode of the second transistor is electrically connected to the third node;

The fourth node control circuit includes a third transistor and a first capacitor;

The control electrode of the third transistor is electrically connected to the sixth node, the first electrode of the third transistor is electrically connected to the third clock signal line, and the second electrode of the third transistor is electrically connected to the fourth node;

The first electrode plate of the first capacitor is electrically connected to the sixth node, and the second electrode plate of the first capacitor is electrically connected to the fourth node;

the fifth node control circuit includes a fourth transistor and a fifth transistor;

The control electrode of the fourth transistor is electrically connected to the first clock signal line, and the first electrode of the fourth transistor is electrically connected to the input end;

The control electrode of the fifth transistor is electrically connected to the second clock signal line, the first electrode of the fifth transistor is electrically connected to the second electrode of the fourth transistor, and the second electrode of the fifth transistor is electrically connected electrically connected to the fifth node;

the second node control circuit includes a sixth transistor and a seventh transistor;

The control electrode of the sixth transistor is electrically connected to the third node, the first electrode of the sixth transistor is electrically connected to the second voltage line, and the second electrode of the sixth transistor is electrically connected to the seventh node;

The control electrode of the seventh transistor is electrically connected to the second node, the first electrode of the seventh transistor is electrically connected to the third clock signal line, and the second electrode of the seventh transistor is electrically connected to the seventh node;

the first node control circuit includes an eighth transistor and a second capacitor;

The control electrode of the eighth transistor is electrically connected to the third clock signal line, the first electrode of the eighth transistor is electrically connected to the fourth node, and the second electrode of the eighth transistor is electrically connected to the first node;

The first electrode plate of the second capacitor is electrically connected to the first node, and the second electrode plate of the second capacitor is electrically connected to the first clock signal line;

the output reset circuit includes a ninth transistor;

The control electrode of the ninth transistor is electrically connected to the second node, the first electrode of the ninth transistor is electrically connected to the first voltage line, and the second electrode of the ninth transistor is electrically connected to the driving signal terminal.

Optionally, the first voltage line is a low voltage terminal, and the second voltage line is a high voltage terminal.

Figure 4:
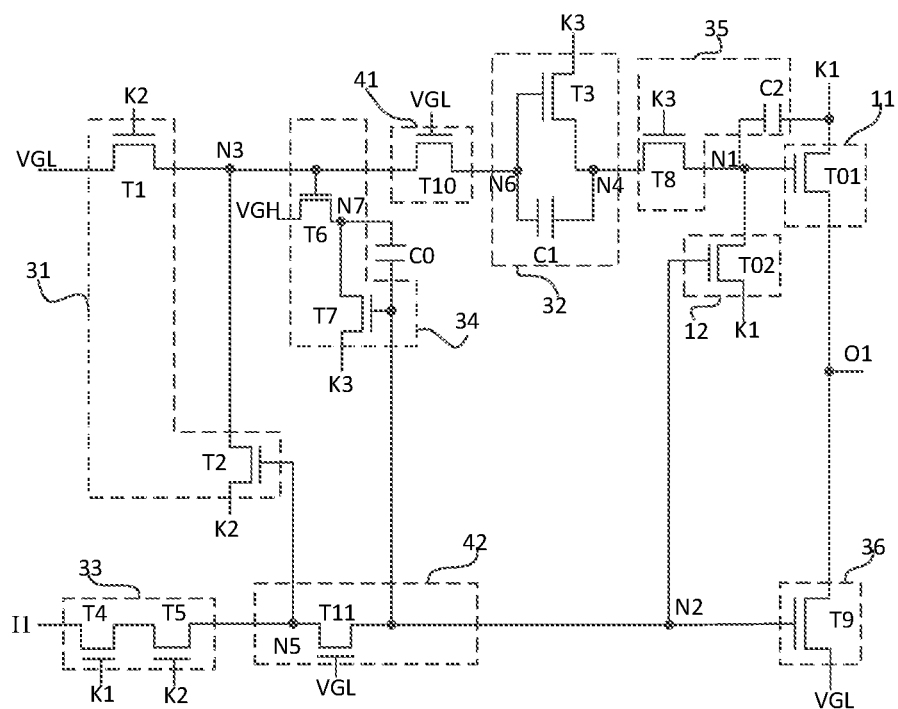
FIG. 4 is a circuit diagram of a driving circuit according to at least one embodiment of the present disclosure.

As shown in FIG. 4, based on at least one embodiment of the driving circuit shown in FIG. 3, the output circuit 11 includes an output transistor T01, and the first node reset circuit 12 includes a first node reset transistor T02;

The gate electrode of the output transistor T01 is electrically connected to the first node N1, the source electrode of the output transistor T01 is electrically connected to the first clock signal line K1, and the drain electrode of the output transistor T01 is electrically connected to the driving signal terminal O1;

The gate electrode of the first node reset transistor T02 is electrically connected to the second node N2, the source electrode of the first node reset transistor T02 is electrically connected to the first node N1, and the drain electrode of the first node reset transistor T02 is electrically connected to the first clock signal line K1;

The first electrode plate of the second node control capacitor C0 is electrically connected to the seventh node N7, and the second electrode plate of the second node control capacitor C0 is electrically connected to the second node N2;

The third node control circuit 31 may include a first transistor T1 and a second transistor T2;

The gate electrode of the first transistor T1 is electrically connected to the second clock signal line K2, the source electrode of the first transistor T1 is electrically connected to the low voltage terminal, and the drain electrode of the first transistor T1 is electrically connected to the third node N3; the low voltage terminal is used to provide the low voltage signal VGL;

The gate electrode of the second transistor T2 is electrically connected to the fifth node N5, the source electrode of the second transistor T2 is electrically connected to the second clock signal line K2, and the drain electrode of the second transistor T2 is electrically connected to the third node N3;

The fourth node control circuit 32 may include a third transistor T3 and a first capacitor C1;

The gate electrode of the third transistor T3 is electrically connected to the sixth node N6, the source electrode of the third transistor T3 is electrically connected to the third clock signal line K3, and the drain electrode of the third transistor T3 is electrically connected to the fourth node N4;

The first electrode plate of the first capacitor C1 is electrically connected to the sixth node N6, and the second electrode plate of the first capacitor C1 is electrically connected to the fourth node N4;

The fifth node control circuit 33 may include a fourth transistor T4 and a fifth transistor T5;

The gate electrode of the fourth transistor T4 is electrically connected to the first clock signal line K1, and the source electrode of the fourth transistor T4 is electrically connected to the input terminal I1;

The gate electrode of the fifth transistor T5 is electrically connected to the second clock signal line K2, the source electrode of the fifth transistor T5 is electrically connected to the drain electrode of the fourth transistor T4, and the drain electrode of the fifth transistor T5 is electrically connected to the fifth node N5;

The second node control circuit 34 may include a sixth transistor T6 and a seventh transistor T7;

The gate electrode of the sixth transistor T6 is electrically connected to the third node N3, the source electrode of the sixth transistor T6 is electrically connected to the high voltage terminal, and the drain electrode of the sixth transistor T6 is electrically connected to the seventh node N7; the high voltage terminal is used to provide a high voltage signal VGH;

The gate electrode of the seventh transistor T7 is electrically connected to the second node N2, the source electrode of the seventh transistor T7 is electrically connected to the third clock signal line K3, and the drain electrode of the seventh transistor T7 is electrically connected to the seventh node N7;

The first node control circuit 35 may include an eighth transistor T8 and a second capacitor C2;

The gate electrode of the eighth transistor T8 is electrically connected to the third clock signal line K3, the source electrode of the eighth transistor T8 is electrically connected to the fourth node N4, and the drain electrode of the eighth transistor T8 is electrically connected to the first node N1;

The first electrode plate of the second capacitor C2 is electrically connected to the first node N1, and the second electrode plate of the second capacitor C2 is electrically connected to the first clock signal line K1;

The output reset circuit 36 may include a ninth transistor T9;

The gate electrode of the ninth transistor T9 is electrically connected to the second node N2, the source electrode of the ninth transistor T9 is electrically connected to the low voltage terminal, and the drain electrode of the ninth transistor T9 is electrically connected to the driving signal terminal O1;

The first conduction control circuit 41 includes a tenth transistor T10, and the second conduction control circuit 42 includes an eleventh transistor T11;

The gate electrode of the tenth transistor T10 is electrically connected to the low voltage terminal, the source electrode of the tenth transistor T10 is electrically connected to the third node N3, and the drain electrode of the tenth transistor T10 is electrically connected to the sixth node N6;

The gate electrode of the eleventh transistor T11 is electrically connected to the low voltage terminal, the source electrode of the eleventh transistor T11 is electrically connected to the fifth node N5, and the drain electrode of the eleventh transistor T11 is electrically connected to the second node N2.

In at least one embodiment of the driving circuit shown in FIG. 4, all transistors may be p-type thin film transistors, but not limited thereto.

In at least one embodiment of the driving circuit shown in FIG. 4, T10 and T11 may be normally-on transistors. In at least one embodiment of the present disclosure, the potential of N6 can be stabilized by setting T10, and the potential of N2 can be stabilized by setting T11.

Figure 5:
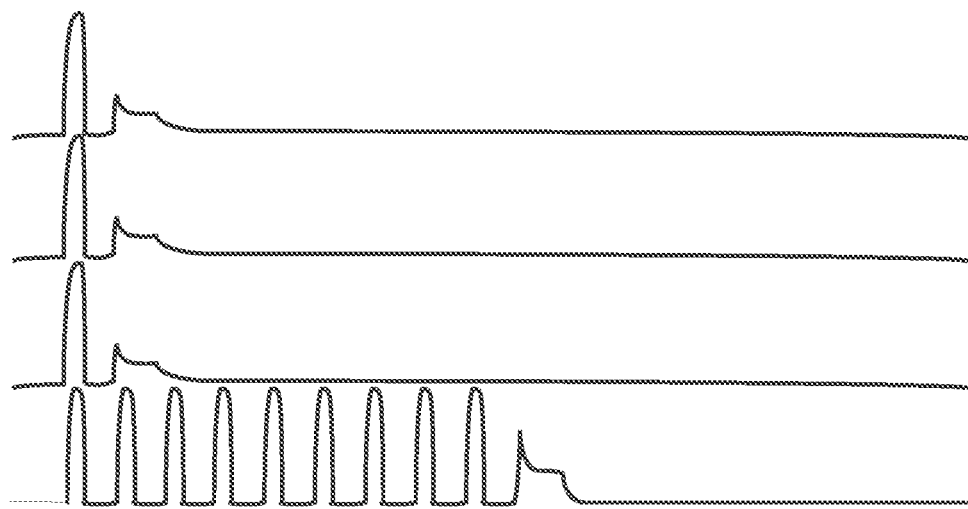
FIGS. 5-9 are simulation waveform diagrams of the driving circuit according to at least one embodiment of the present disclosure.

The driving circuit shown in FIG. 4 is simulated, when the inter-electrode capacitance CV of T01 remains unchanged at 400 fF, as shown in FIG. 5, when the width-to-length ratio of T01 is less than or equal to 210/3.8, the driving signal outputted by the driving signal terminal O1 is normal.

In FIG. 5, the waveforms from top to bottom (the waveform of the driving signal provided by the driving signal terminal) are: the waveform of the driving signal when the channel width of T01 is 100 um and the channel length of T01 is 3.8 um; the waveform of the driving signal when the channel width of T01 is 150 um and the channel length of T01 is 3.8 um; the waveform of the driving signal when the channel width of T01 is 210 um and the channel length of T01 is 3.8 um; the waveform of the driving signal when the channel width is 250 um and the channel length of T01 is 3.8 um.

Figure 6:
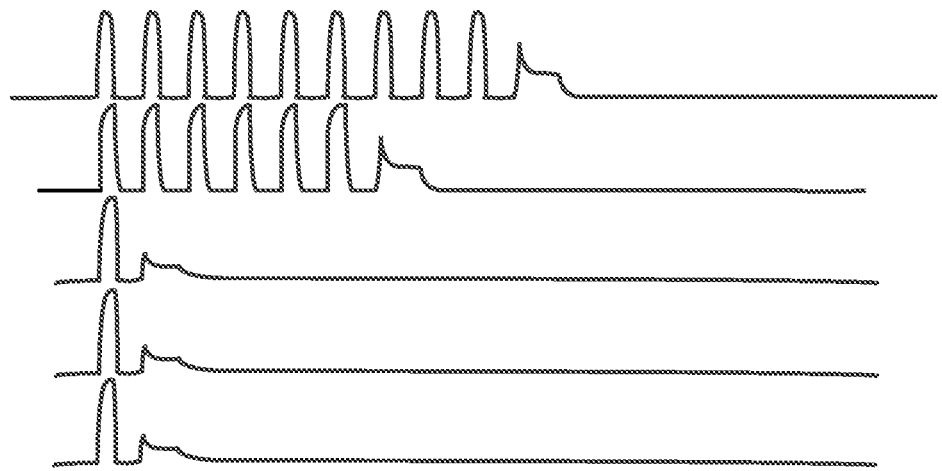

The driving circuit shown in FIG. 4 is simulated, when the CV of T01 remains unchanged at 400 fF, as shown in FIG. 6, when the width-to-length ratio of T02 is greater than or equal to 5/4.9, the driving signal outputted by the driving signal terminal O1 is normal.

In FIG. 6, the waveforms from top to bottom (the waveform of the driving signal provided by the driving signal terminal) are: the waveform of the driving signal when the channel width of T02 is 3 um and the channel length of T02 is 4.9 um; the waveform of the driving signal when the channel width of T02 is 4 um and the channel length of T02 is 4.9 um; the waveform of the driving signal when the channel width of T02 is 5 um and the channel length of T02 is 4.9 um; the waveform of the driving signal when the channel width is 6 um and the channel length of T02 is 4.9 um; the waveform of the driving signal when the channel width of T02 is 7 um and the channel length of T02 is 4.9 um.

Figure 7:
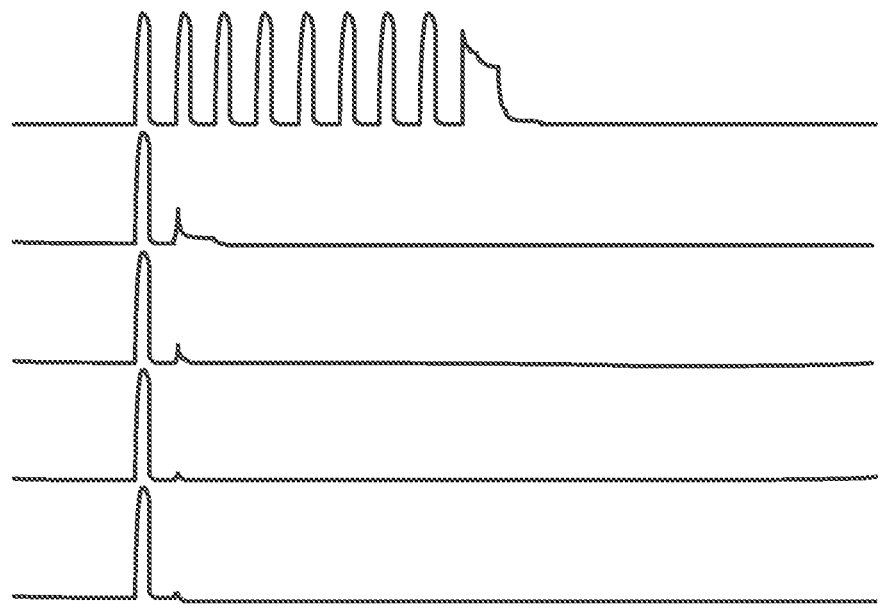

The driving circuit shown in FIG. 4 is simulated, when the CV of T01 remains unchanged at 400 fF, as shown in FIG. 7, when the capacitance value of C0 is greater than or equal to 143 fF, the driving signal outputted by the driving signal terminal O1 is normal.

In FIG. 7, the waveforms from top to bottom (the waveform of the driving signal provided by the driving signal terminal) are: the waveform of the driving signal when the capacitance value of C0 is 93 fF; the waveform of the driving signal when the capacitance value of C0 is 143 fF; the waveform of the driving signal when the capacitance value of C0 is 193 fF; the waveform of the driving signal when the capacitance value of C0 is 243 fF; the waveform of the driving signal when the capacitance value of C0 is 293 fF.

Figure 8:
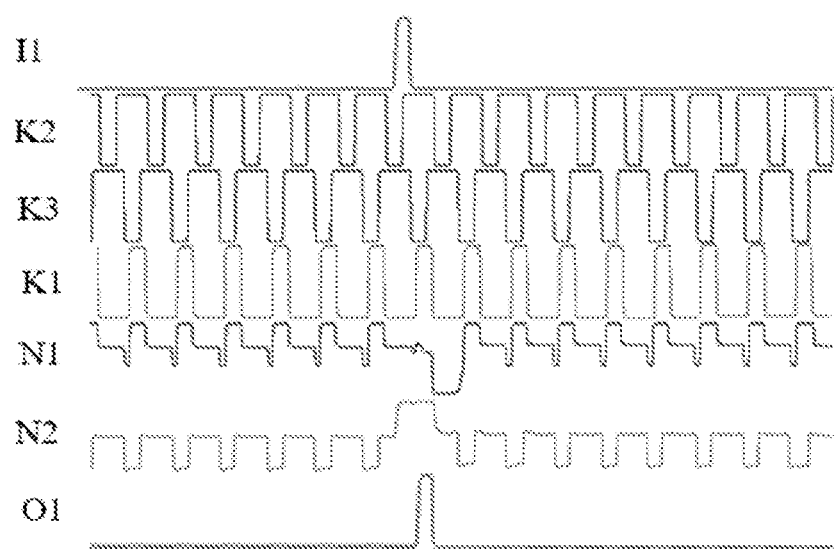

As shown in FIG. 8, when the width-to-length ratio of T01 is 210/3.8, the width-to-length ratio of T02 is 6/4.9, and the capacitance value of C0 is 243 fF, the driving circuit shown in FIG. 4 is simulated, the waveform of the driving signal is normal.

Figure 9:
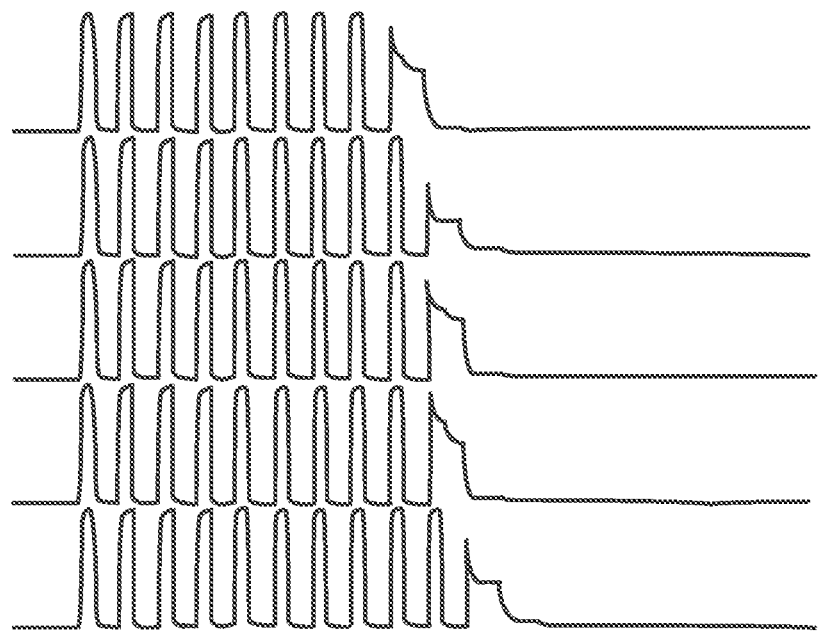

As shown in FIG. 9, when the CV of T01 remains unchanged at 400 fF, when the capacitance value of C2 is changed, the waveform of the driving signal will not be improved.

In FIG. 9, the waveforms from top to bottom (the waveform of the driving signal provided by the driving signal terminal) are: the waveform of the driving signal when the capacitance value of C2 is 146 fF; the waveform of the driving signal when the capacitance value of C2 is 196 fF; the waveform of the driving signal when the capacitance value of C2 is 246 fF; the waveform of the driving signal when the capacitance value of C2 is 296 fF; the waveform of the driving signal when the capacitance value of C2 is 346 fF. It can be seen from the waveforms in FIG. 9 that the adjusting of the capacitance value of C2 does not improve the waveform of the driving signal.

The display substrate according to the embodiment of the present disclosure includes the above-mentioned driving circuit arranged on the substrate.

In at least one embodiment of the present disclosure, the driving circuit includes an output circuit; the output circuit includes an output transistor;

The active layer of the output transistor includes at least one first channel portion extending in a first direction;

The sum of the widths of the at least one first channel portion along the first direction is less than or equal to the first predetermined width, so that the width-to-length ratio of the output transistor is less than or equal to the first predetermined width-to-length ratio.

In at least one embodiment of the present disclosure, when the output transistor includes only one first channel portion, the width of the first channel portion along the first direction is the width of the channel of the output transistor.

Optionally, the first direction may be substantially the same as the extending direction of the gate line arranged in the display area.

In at least one embodiment of the present disclosure, the range of the first predetermined width-to-length ratio may be greater than or equal to 150/3.8 and less than or equal to 230/3.8, and the range of the second predetermined width-to-length ratio may be is greater than or equal to 4/4.9 and less than or equal to 6/4.9.

Optionally, the first predetermined width-to-length ratio is 210/3.8, but not limited thereto.

Optionally, when the length of the channel of the output transistor is 3.8 um, the first predetermined width may be 210 um.

In at least one embodiment of the present disclosure, the driving circuit includes a first node reset circuit; the first node reset circuit includes a first node reset transistor;

The active layer of the first node reset transistor includes at least one second channel portion;

The sum of the widths of the at least one second channel portion along the first direction is greater than or equal to a second predetermined width, so that the width-to-length ratio of the first node reset transistor is greater than or equal to the second predetermined width-to-length ratio.

In at least one embodiment of the present disclosure, when the active layer of the first node reset transistor includes only one second channel portion, the width of the second channel portion along the second direction is the width of the channel of the first node reset transistor;

The first direction intersects the second direction.

Optionally, the second direction may be substantially the same as the extending direction of the data line arranged in the display area.

Optionally, the second predetermined width-to-length ratio is 5/4.9, but not limited thereto.

Optionally, when the length of the channel of the first node reset transistor is 4.9 um, the second predetermined width may be 5 um.

The display substrate according to at least one embodiment of the present disclosure further includes gate lines and data lines arranged in the display area;

The gate line includes a portion extending in the first direction, and the data line includes a portion extending in the second direction.

During specific implementation, the display substrate described in at least one embodiment of the present disclosure may further include a plurality of of gate lines and a plurality of data lines arranged in the display area;

The gate line includes a portion extending along a first direction, the data line includes a portion extending along a second direction, and the driving circuit may be arranged in a first edge region of the display substrate and/or a second edge region of the display substrate. The first edge region may be arranged on the left side of the display area, and the second edge region may be set on the right side of the display area.

In at least one embodiment of the present disclosure, the driving circuit includes a second node control capacitor; the second node control capacitor includes a first electrode plate and a second electrode plate arranged at different layers; the first electrode plate and the second electrode plate are provided with an insulating layer;

An orthographic projection of the first electrode plate on the substrate at least partially overlaps an orthographic projection of the second electrode plate on the substrate, and the overlapping area between the orthographic projection of the first electrode plate on the substrate and the orthographic projection of the second electrode plates on the substrate is greater than or equal to a predetermined area, so that the capacitance value of the second node control capacitor is greater than or equal to the predetermined capacitance value.

In at least one embodiment of the present disclosure, the range of the predetermined capacitance value may be greater than or equal to 143 fF and less than or equal to 243 fF.

Optionally, the predetermined capacitance value may be 243 fF, but not limited thereto.

Figure 10:
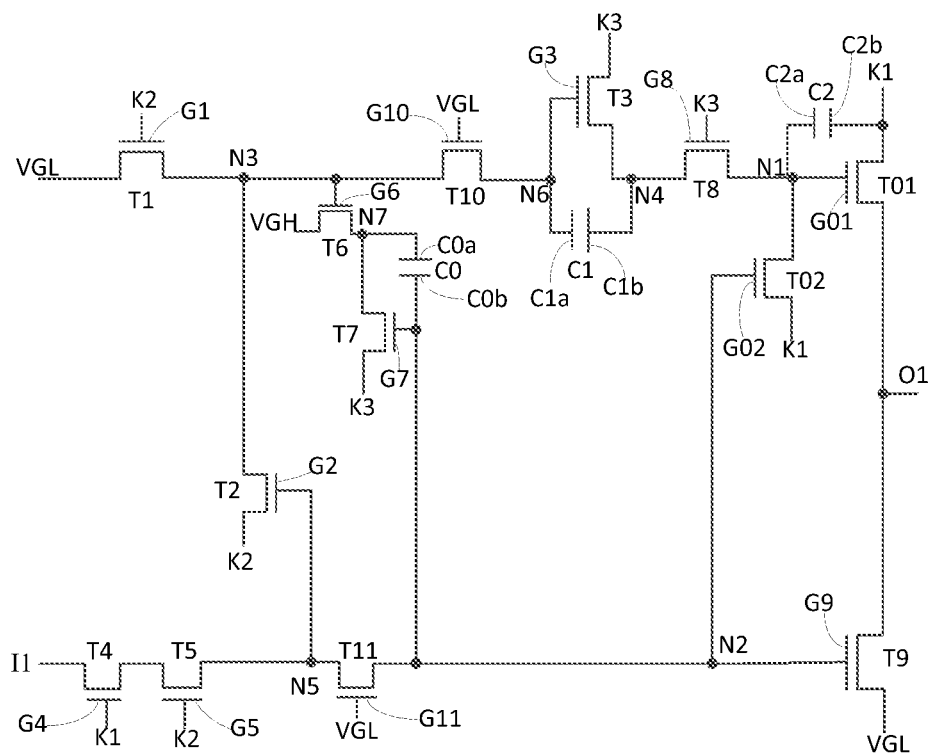
FIG. 10 is a schematic diagram showing the gate electrode of each transistor and the electrode plate of each capacitor on the basis of FIG. 4.

FIG. 10 is a schematic diagram showing the gate electrode of each transistor and the electrode plate of each capacitor on the basis of FIG. 4.

In FIG. 10, G1 is the gate electrode of T1, G2 is the gate electrode of T2, G3 is the gate electrode of T3, G4 is the gate electrode of T4, and G5 is the gate electrode of T5, G6 is the gate electrode of T6, G7 is the gate electrode of T7, G8 is the gate electrode of T8, and G9 is the gate electrode of T9, G10 is the gate electrode of T10, G11 is the gate electrode of T11, G01 is the gate electrode of T01, G02 is the gate electrode of T02, and C0a is the first electrode plate of C0, C1a is the first electrode plate of C1, C2a is the first electrode plate of C2, C1b is the second electrode plate of C1, C2b is the second electrode plate of C2.

Figure 11:
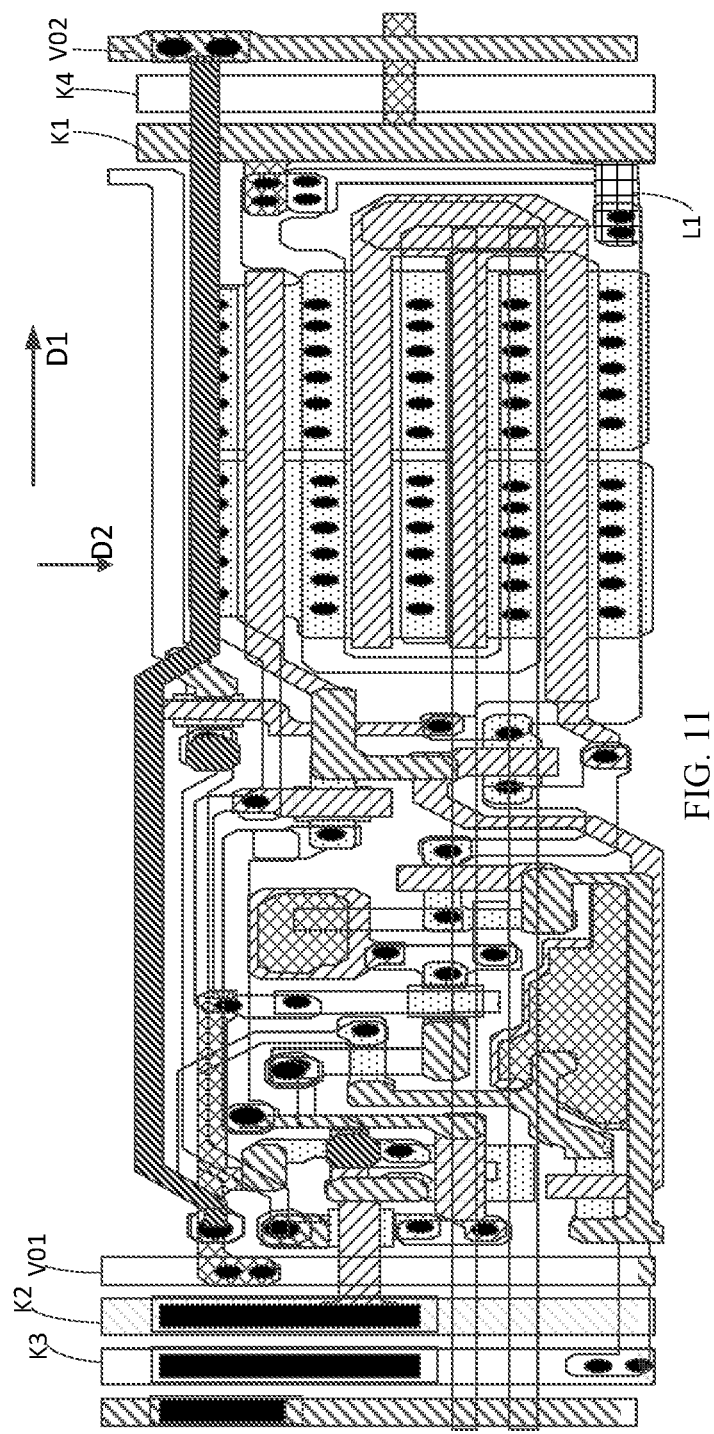
FIG. 11 is a schematic diagram of a layout of a driving circuit provided by at least one embodiment of the present disclosure.
Figure 12:
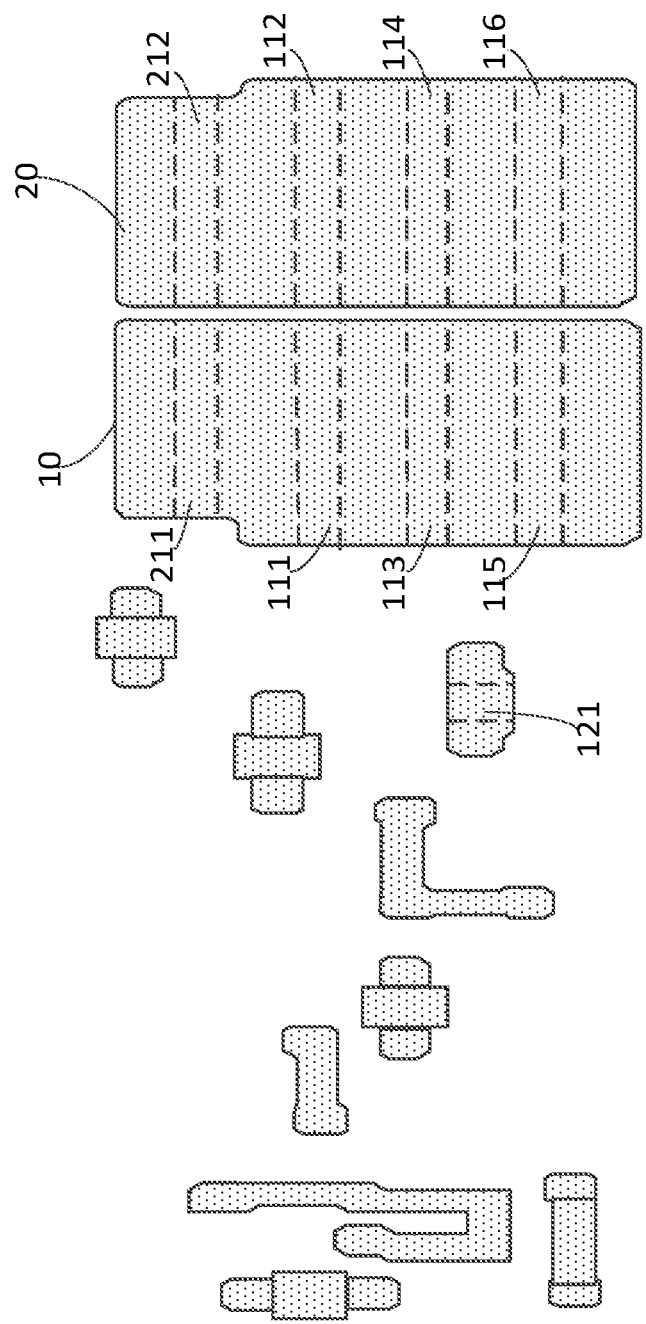
FIG. 12 is a schematic diagram of the active layer in FIG. 11.
Figure 13:
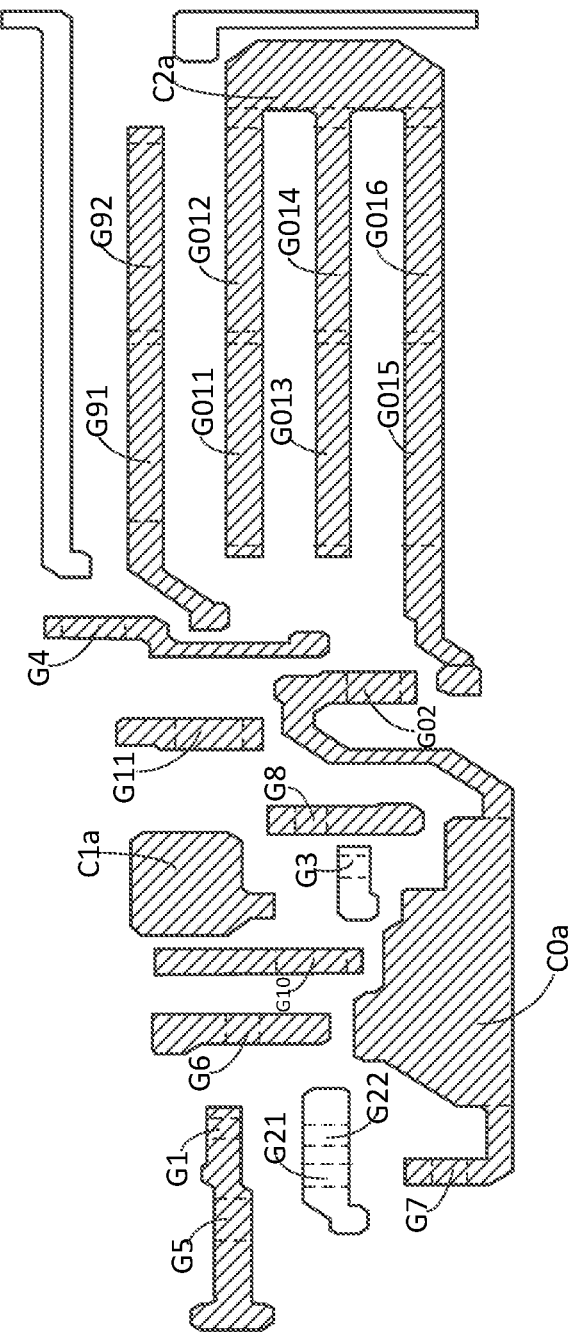
FIG. 13 is a schematic diagram of the first gate metal layer in FIG. 11.
Figure 14:
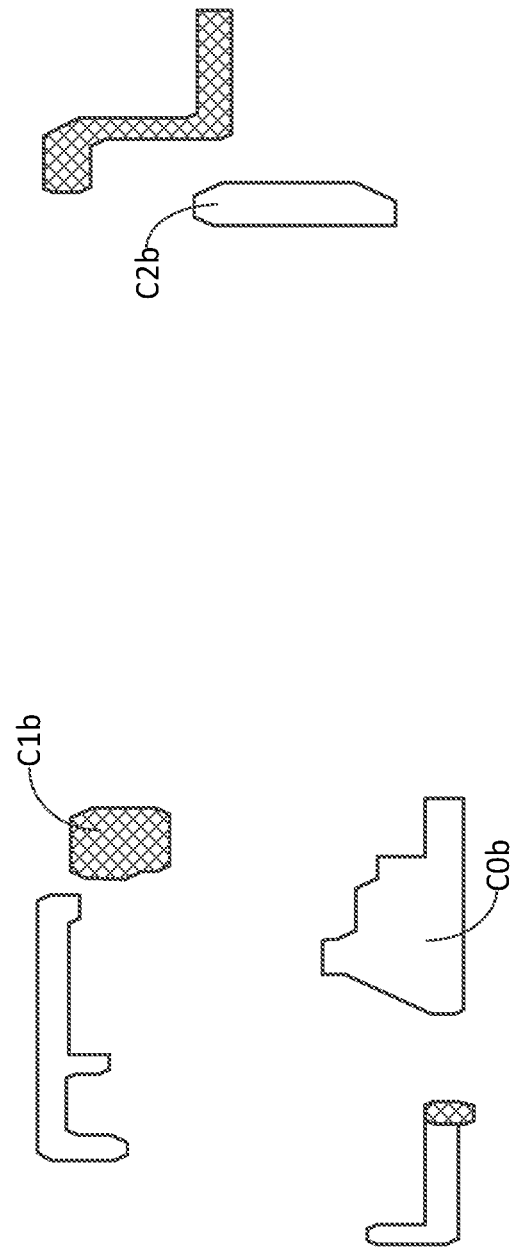
FIG. 14 is a schematic diagram of the second gate metal layer in FIG. 11.
Figure 17:
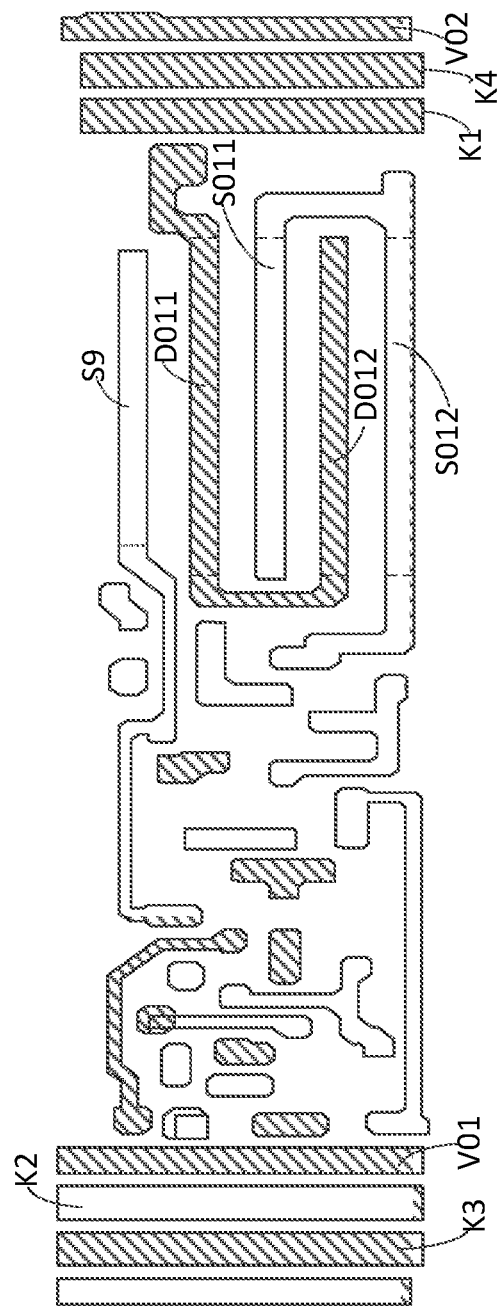
FIG. 17 is a schematic diagram of the first source-drain metal layer in FIG. 11.
Figure 19:
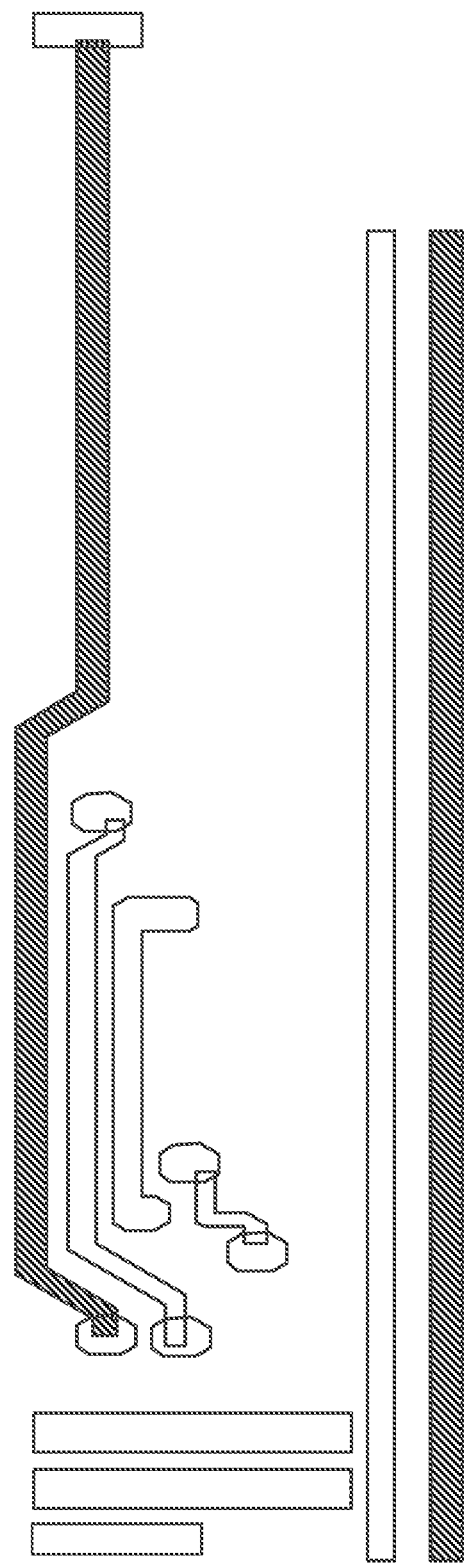
FIG. 19 is a schematic diagram of the second source-drain metal layer in FIG. 11.

FIG. 11 is a schematic diagram of a layout of a driving circuit provided by at least one embodiment of the present disclosure; FIG. 12 is a schematic diagram of the active layer in FIG. 11; FIG. 13 is a schematic diagram of the first gate metal layer in FIG. 11; FIG. 14 is a schematic diagram of the second gate metal layer in FIG. 11; FIG. 17 is a schematic diagram of the first source-drain metal layer in FIG. 11; FIG. 19 is a schematic diagram of the second source-drain metal layer in FIG. 11.

In the schematic diagram of the layout shown in FIG. 11, the first direction D1 may be a vertical direction, and the second direction D2 may be a horizontal direction.

As shown in FIG. 12, the active layer of the output transistor T01 includes a first first channel portion 111, a second first channel portion 112, a third first channel portion 113, a fourth first channel portion 113, a fifth first channel portion 115 and a sixth first channel portion 116; the first first channel portion 111, the second first channel portion 112, the third first channel portion 113, the fourth first channel portion 114, the fifth first channel portion 115, and the sixth first channel portion 116 are all extended along the first direction;

The active layer of the ninth transistor T9 includes a first third channel portion 211 extending along the first direction and a second third channel portion 212 extending along the first direction;

The sum of the width of the first first channel portion 111 along the first direction, the width of the second first channel portion 112 along the first direction, the width of the third first channel portion 113 along the first direction, the width of the fourth first channel portion 114 along the first direction, the width of the fifth first channel portion 115 along the first direction, and the width of the sixth first channel portion 116 along the first direction is the width of the channel of the output transistor T01.

As shown in FIG. 12, the active layer of the first node reset transistor T02 includes a second channel portion 121; the width of the channel of T02 is the width of the second channel portion 121 along the second direction.

In at least one embodiment shown in FIG. 12, the active layer of T01 and the active layer of T9 are formed by a first semiconductor layer 10 and a second semiconductor layer 20; the first semiconductor layer 10 and the second semiconductor layer 20 are independent of each other (in order to prevent the influence of the heating effect during operation of the transistor on the characteristics of the transistor due to the large area of the continuous active layer of the transistor, the first semiconductor layer 10 and the second semiconductor layer 20 can be independent of each other).

Optionally, the active layer of the output transistor T01 and the active layer of the ninth transistor T9 may also be formed of a continuous semiconductor layer.

As shown in FIG. 13, the first output reset gate pattern included in the gate electrode of T9 is labeled G91, the second output reset gate pattern included in the gate electrode of T9 is labeled G92, and the gate electrode of G01 includes the first output reset gate pattern G011, a second output gate pattern G012, a third output gate pattern G013, a fourth output gate pattern G014, a fifth output gate pattern G015 and a sixth output gate pattern G016;

G1 is the gate electrode of T1, the gate electrode of T2 includes a first gate pattern G21 and a second gate pattern G22, G3 is the gate electrode of T3, G4 is the gate electrode of T4, G5 is the gate electrode of T5, G6 is the gate electrode of T6, G7 is the gate electrode of T7, G8 is the gate electrode of T8, G10 is the gate electrode of T10, G11 is the gate electrode of T11, G02 is the gate electrode of T02, C0a is the first electrode plate of C0, C1a is the first electrode plate of C1, and C2a is the first electrode plate of C2.

In FIG. 14, C0b is the second electrode plate of C0, C1b is the second electrode plate of C1, and C2b is the second electrode plate of C2.

As shown in FIG. 11, FIG. 13 and FIG. 14, the orthographic projection of C0b on the substrate is within the orthographic projection of C0a on the substrate; C0a and C0b may be parallel to the substrate, and the area of the orthographic projection of C0b on the substrate is greater than or equal to the predetermined area, so that the capacitance value of C0 is greater than or equal to the predetermined capacitance value.

Figure 15:
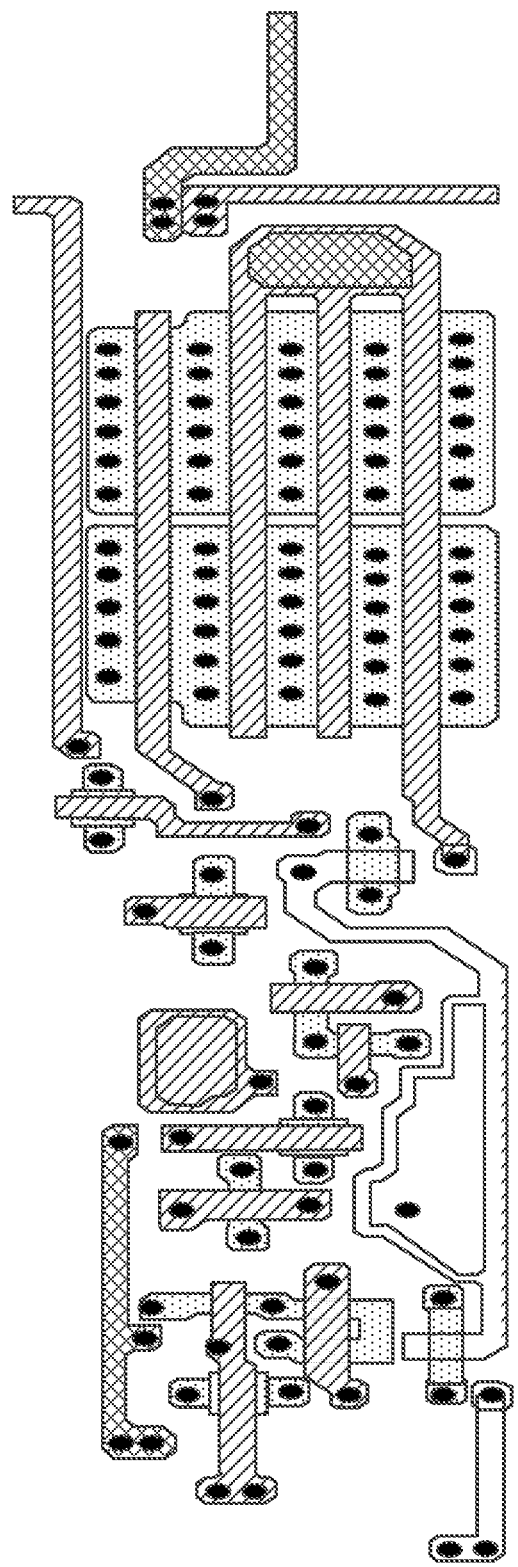
FIG. 15 is a schematic diagram of a plurality of via holes provided on the substrate provided with the active layer, the first gate insulating layer, the first gate metal layer, the second gate insulating layer, the second gate metal layer and the first interlayer dielectric layer Schematic diagram.

After the active layer, the first gate insulating layer, the first gate metal layer, the second gate insulating layer and the second gate metal layer are sequentially arranged on the substrate, a first interlayer dielectric layer is provided on a side of the second gate metal layer away from the second gate insulating layer, and via holes penetrating the first interlayer dielectric layer are provided. The black dots shown in FIG. 15 show via holes penetrating the first interlayer dielectric layer.

Figure 16:
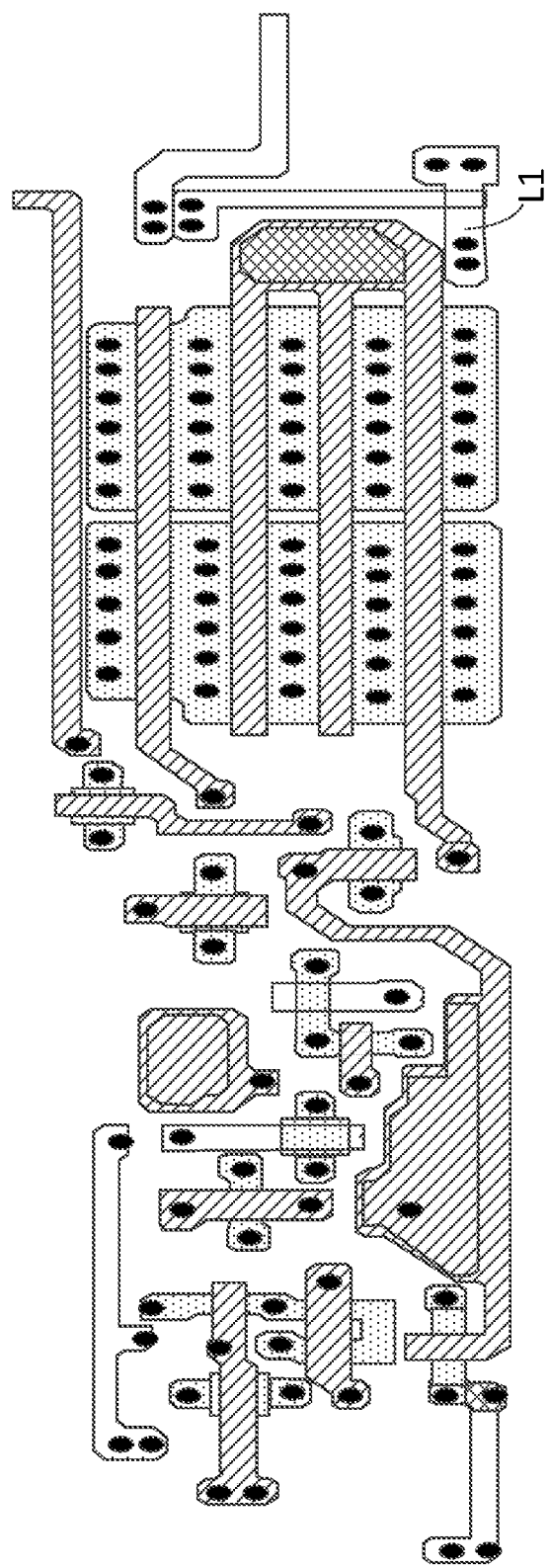
FIG. 16 is a schematic diagram of a conductive connection portion L1 provided on the basis of FIG. 15.
Figure 18:
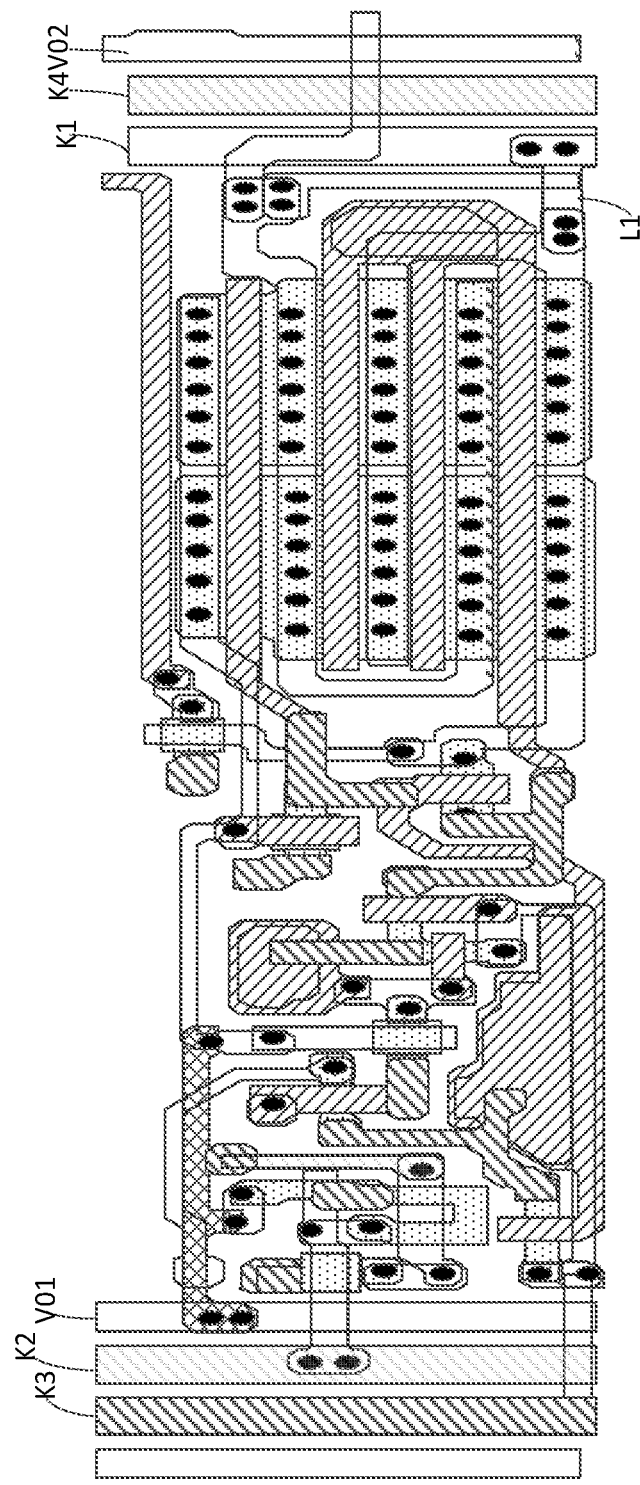
FIG. 18 is a schematic diagram of the active layer, the first gate metal layer, the second gate metal layer, the third gate metal layer and the first source-drain metal layer that are stacked in FIG. 11.

A third gate metal layer is provided on a side of the first interlayer dielectric layer away from the second gate metal layer; as shown in FIG. 16, a patterning process is performed on the third gate metal layer to form a conductive connection portion L1. Afterwards, a second interlayer dielectric layer is provided on the side of the third gate metal layer away from the first interlayer dielectric layer, and via holes penetrating the second interlayer dielectric layer are provided, so that the conductive connection parts L1 are respectively electrically connected to K1 and the source electrode of T01 (as shown in FIG. 18).

In FIG. 17, V02 is the high-voltage line that provides the high-voltage signal VGH, V01 is the low-voltage line that provides the low-voltage signal VGL; K1 is the first clock signal line, K2 is the second clock signal line, K3 is the third clock signal line, and K4 is the fourth clock signal line.

In FIG. 17, the source electrode of T9 is labeled S9, the drain electrode of T01 includes a first drain pattern D011 and a second drain pattern D012, and the source electrode of T01 includes a first source pattern S011 and a second source pattern S012: D0/1 is multiplexed as the drain electrode of T9.

Figure 20:
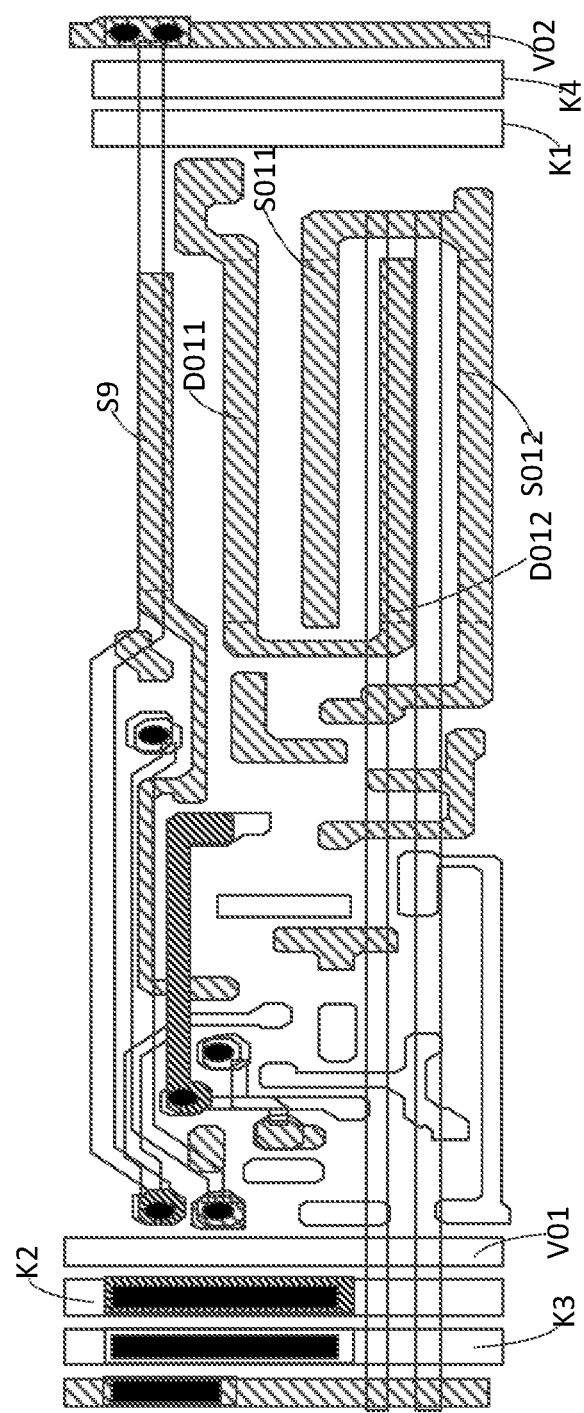
FIG. 20 is a schematic diagram of the first source-drain metal layer and the second source-drain metal layer that are stacked.

FIG. 20 is a schematic diagram of the first source-drain metal layer and the second source-drain metal layer after stacking, and a passivation layer and a first planarization layer may be sequentially arranged between the first source-drain metal layer and the second source-drain metal layer; in FIG. 20, black rectangles and black circles show via holes penetrating the passivation layer and the first planarization layer.

When manufacturing the display substrate according to at least one embodiment of the present disclosure, a semiconductor material layer is firstly formed on the substrate, and a patterning process is performed on the semiconductor material layer to form an active layer of each transistor; a first gate insulating layer is formed on a side of the actively layer away from the substrate; a first gate metal layer is formed on a side of the first gate insulating layer away from the active layer, and a patterning process is performed on the first gate metal layer to form the gate electrodes of the transistors in the driving circuit and the first electrode plates of the capacitors. Using the gate electrode of each transistor as a mask, the part of the active layer not covered by the gate electrode is doped, so that the part of the active layer not covered by the gate electrode is formed as a conductive portion, and a part of the active layer covered by the gate electrode is formed as a channel portion; the conductive portion serves as a source electrode or drain electrode, or is coupled to the source electrode or drain electrode. A second gate insulating layer is formed on the side of the first gate metal layer away from the active layer, and a second gate metal layer is arranged on the side of the second gate insulating layer away from the first gate metal layer; a patterning process is implemented on the second gate metal layer to form the second electrode plates of the capacitors in the driving circuit and the connecting conductive portions; a first interlayer dielectric layer is formed on a side of the second gate metal layer away from the second gate insulating layer. A plurality of via holes are arranged on the substrate provided with the active layer, the first gate insulating layer, the first gate metal layer, the second gate insulating layer, the second gate metal layer and the first interlayer dielectric layer. A third gate metal layer is formed on the side of the first interlayer dielectric layer away from the second gate metal layer. A patterning process is performed on the third gate metal layer to form a conductive connection portion L1. A second interlayer dielectric layer is formed on the side of the third gate metal layer away from the first interlayer dielectric layer. A first source-drain metal layer is formed on the side of the second interlayer dielectric layer away from the third gate metal layer, and a patterning process is performed on the first source-drain metal layer to form clock signal lines and voltage lines, connecting conductive portions, the source electrode of T9, the source electrode of T01, and the drain electrode of T01. A passivation layer and a planarization layer are sequentially arranged on the side of the first source-drain metal layer away from the second interlayer dielectric layer. The via holes are formed on the substrate provided with the active layer, the first gate insulating layer, the first gate metal layer, the second gate insulating layer, the second gate metal layer, the first interlayer dielectric layer, the third gate metal layer, the second interlayer dielectric layer, the first source-drain metal layer, the passivation layer and the planarization layer. A second source-drain metal layer is formed on the side of the planarization layer away from the first source-drain metal layer. A patterning process is performed on the second source-drain metal layer to form a connecting conductive portion.

The display device according to the embodiment of the present disclosure includes the above-mentioned display substrate.

The display device according to at least one embodiment of the present disclosure further includes a voltage supply circuit; the first voltage signal is a low voltage signal VGL, and the second voltage signal is a high voltage signal VGH;

the voltage providing circuit is used for providing the first voltage signal and the second voltage signal, and controlling a difference value between the second voltage value and the first voltage value to be greater than a predetermined difference value;

The second voltage value is a voltage value of the second voltage signal, and the first voltage value is a voltage value of the first voltage signal;

When the potential of the clock signal provided by each clock signal line included in the driving circuit in the display substrate is a low voltage, the voltage value of the clock signal is the first voltage value;

When the potential of the clock signal provided by each clock signal line is a high voltage, the voltage value of the clock signal is the second voltage value.

The embodiment of the present disclosure increases the voltage difference between the voltage value of VGH and the voltage value of VGL, so that when T01 needs to be turned off, T01 is turned off due to the potential of the gate electrode of T01, so as to achieve normal output of the driving circuit and normal screen display.

In at least one embodiment of the present disclosure, the predetermined difference value may be 14V, but not limited thereto.

For example, when at least one embodiment of the driving circuit shown in FIG. 4 is working, when the potential of N2 is a low voltage and T02 is turned on, so that N1 receives the first clock signal provided by K1, then when the first clock signal is a high voltage, by increasing the voltage difference between the voltage value of the high voltage signal and the voltage value of the low voltage signal, T01 can be turned off in a better way.

After simulation, when at least one embodiment of the driving circuit shown in FIG. 4 is in working, the voltage value of VGH is 7V, the voltage value of VGL is −7V, and T01 is in PBTS (positive bias temperature stress), the gate-source voltage of T01 is −8.24V, and the drain-source voltage of T01 is 2.98V; when the voltage value of VGH is 10V, the voltage value of VGL is −10V, and T01 is in PBTS, the gate-source voltage of T01 is −13.65V, and the drain-source voltage of T01 is 0.99V.

The display device provided by the embodiment of the present disclosure may be any product or component with a display function, such as a mobile phone, a tablet computer, a television, a monitor, a notebook computer, a digital photo frame, and a navigator.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A driving circuit, comprising an output circuit, a first node reset circuit and a second node control capacitor; wherein the output circuit is configured to control a driving signal terminal to output a driving signal under the control of a potential of a first node;

the first node reset circuit is configured to control to reset the first node under the control of a potential of a second node;

the second node control capacitor is electrically connected to the second node;

a width-to-length ratio of an output transistor included in the output circuit is less than or equal to a first predetermined width-to-length ratio; and/or a width-to-length ratio of a first node reset transistor included in the first node reset circuit is greater than or equal to a second predetermined width-to-length ratio; and/or, a capacitance value of the second node control capacitor is greater than or equal to a predetermined capacitance value;

a range of the first predetermined width-to-length ratio is greater than or equal to 150/3.8 and less than or equal to 230/3.8, and a range of the second predetermined width-to-length ratio is greater than or equal to 4/4.9 and less than or equal to 6/4.9; a range of the predetermined capacitance value is greater than or equal to 143fF and less than or equal to 243fF;

wherein the driving circuit further comprises a third node control circuit, a fourth node control circuit, a fifth node control circuit, a second node control circuit, a first node control circuit, and an output reset circuit;

the third node control circuit is respectively electrically connected to a second clock signal line, a first voltage line and a third node, and is configured to write a first voltage signal provided by the first voltage line into the third node under the control of a second clock signal provided by the second clock signal line;

the fourth node control circuit is respectively electrically connected to a sixth node, a third clock signal line and a fourth node, and is configured to control the third clock signal line to write a third clock signal into the fourth node under the control of a potential of the sixth node, and control a potential of the fourth node according to the potential of the sixth node;

the fifth node control circuit is electrically connected to the second clock signal line, a first clock signal line, an input terminal and a fifth node respectively, and is configured to control the input terminal to provide an input signal to the fifth node under the control of the second clock signal provided by the second clock signal line and a first clock signal provided by the first clock signal line;

the second node control circuit is respectively electrically connected to a third node, a seventh node, a second voltage line, a second node and a third clock signal line, and is configured to control to connect the seventh node and the second voltage line under the control of a potential of the third node, and control to connect the seventh node and the third clock signal line under the control of the potential of the second node;

a first electrode plate of the second node control capacitor is electrically connected to the seventh node, and a second electrode plate of the second node control capacitor is electrically connected to the second node;

the first node control circuit is respectively electrically connected to the fourth node, the third clock signal line and the first node, and is configured to control to connect the fourth node and the first node under the control of the third clock signal provided by the third clock signal line;

the output reset circuit is respectively electrically connected to the second node, the driving signal terminal and the first voltage line, and is configured to control to connect the driving signal terminal and the first voltage line under the control of the potential of the second node.

2. The driving circuit according to claim 1, wherein the first predetermined width-to-length ratio is 210/3.8, the second predetermined width-to-length ratio is 5/4.9, and the predetermined capacitance value is 243fF.

3. The driving circuit according to claim 2, wherein a control electrode of the output transistor is electrically connected to the first node, a first electrode of the output transistor is electrically connected to a first clock signal line, and a second electrode of the output transistor is electrically connected to the driving signal terminal;

a control electrode of the first node reset transistor is electrically connected to the second node, a first electrode of the first node reset transistor is electrically connected to the first node, and a second electrode of the first node reset transistor is electrically connected to the first clock signal line.

4. The driving circuit according to claim 1, wherein a control electrode of the output transistor is electrically connected to the first node, a first electrode of the output transistor is electrically connected to a first clock signal line, and a second electrode of the output transistor is electrically connected to the driving signal terminal;

a control electrode of the first node reset transistor is electrically connected to the second node, a first electrode of the first node reset transistor is electrically connected to the first node, and a second electrode of the first node reset transistor is electrically connected to the first clock signal line.

5. The driving circuit according to claim 1, wherein the third node and the sixth node are a same node; or, the driving circuit further includes a first conduction control circuit; the first conduction control circuit is configured to control to connect the third node and the sixth node under the control of the first voltage signal provided by the first voltage line.

6. The driving circuit according to claim 1, wherein the fifth node and the second node are a same node; or, the driving circuit further includes a second conduction control circuit; the second conduction control circuit is configured to control to connect the fifth node and the second node under the control of the first voltage signal provided by the first voltage line.

7. The driving circuit according to claim 1, wherein the third node control circuit includes a first transistor and a second transistor;

a control electrode of the first transistor is electrically connected to the second clock signal line, a first electrode of the first transistor is electrically connected to the first voltage line, and a second electrode of the first transistor is electrically connected to the third node;

a control electrode of the second transistor is electrically connected to the fifth node, a first electrode of the second transistor is electrically connected to the second clock signal line, and a second electrode of the second transistor is electrically connected to the third node;

the fourth node control circuit includes a third transistor and a first capacitor;

a control electrode of the third transistor is electrically connected to the sixth node, a first electrode of the third transistor is electrically connected to the third clock signal line, and a second electrode of the third transistor is electrically connected to the fourth node;

a first electrode plate of the first capacitor is electrically connected to the sixth node, and a second electrode plate of the first capacitor is electrically connected to the fourth node;

the fifth node control circuit includes a fourth transistor and a fifth transistor;

a control electrode of the fourth transistor is electrically connected to the first clock signal line, and a first electrode of the fourth transistor is electrically connected to an input end;

a control electrode of the fifth transistor is electrically connected to the second clock signal line, a first electrode of the fifth transistor is electrically connected to a second electrode of the fourth transistor, and a second electrode of the fifth transistor is electrically connected to the fifth node;

the second node control circuit includes a sixth transistor and a seventh transistor;

a control electrode of the sixth transistor is electrically connected to the third node, a first electrode of the sixth transistor is electrically connected to the second voltage line, and a second electrode of the sixth transistor is electrically connected to the seventh node;

a control electrode of the seventh transistor is electrically connected to the second node, a first electrode of the seventh transistor is electrically connected to the third clock signal line, and a second electrode of the seventh transistor is electrically connected to the seventh node;

the first node control circuit includes an eighth transistor and a second capacitor;

a control electrode of the eighth transistor is electrically connected to the third clock signal line, a first electrode of the eighth transistor is electrically connected to the fourth node, and a second electrode of the eighth transistor is electrically connected to the first node;

a first electrode plate of the second capacitor is electrically connected to the first node, and a second electrode plate of the second capacitor is electrically connected to the first clock signal line;

the output reset circuit includes a ninth transistor;

a control electrode of the ninth transistor is electrically connected to the second node, a first electrode of the ninth transistor is electrically connected to the first voltage line, and a second electrode of the ninth transistor is electrically connected to the driving signal terminal.

8. A display substrate comprising the driving circuit according to claim 7 arranged on a substrate.

9. The display substrate according to claim 8, wherein the driving circuit comprises an output circuit; the output circuit comprises an output transistor;

an active layer of the output transistor includes at least one first channel portion extending in a first direction;

a sum of widths of the at least one first channel portion along the first direction is less than or equal to a first predetermined width, so that the width-to-length ratio of the output transistor is less than or equal to the first predetermined width-to-length ratio.

10. The display substrate according to claim 9, further comprising a gate line and a data line arranged in a display area;

the gate line includes a portion extending in the first direction, and the data line includes a portion extending in a second direction.

11. The display substrate according to claim 9, wherein the driving circuit comprises a second node control capacitor; the second node control capacitor includes a first electrode plate and a second electrode plate arranged at different layers; the first electrode plate and the second electrode plate are provided with an insulating layer;

an orthographic projection of the first electrode plate on the substrate at least partially overlaps an orthographic projection of the second electrode plate on the substrate, and an overlapping area between the orthographic projection of the first electrode plate on the substrate and the orthographic projection of the second electrode plates on the substrate is greater than or equal to a predetermined area, so that a capacitance value of the second node control capacitor is greater than or equal to the predetermined capacitance value.

12. The display substrate according to claim 8, wherein the driving circuit comprises a first node reset circuit; the first node reset circuit comprises a first node reset transistor;
  an active layer of the first node reset transistor includes at least one second channel portion;
  a sum of widths of the at least one second channel portion along a second direction is greater than or equal to a second predetermined width, so that the width-to-length ratio of the first node reset transistor is greater than or equal to the second predetermined width-to-length ratio;
  a first direction and the second direction intersect.

13. The display substrate according to claim 12, further comprising a gate line and a data line arranged in a display area;
  the gate line includes a portion extending in the first direction, and the data line includes a portion extending in the second direction.

14. The display substrate according to claim 12, wherein the driving circuit comprises a second node control capacitor; the second node control capacitor includes a first electrode plate and a second electrode plate arranged at different layers; the first electrode plate and the second electrode plate are provided with an insulating layer;
  an orthographic projection of the first electrode plate on the substrate at least partially overlaps an orthographic projection of the second electrode plate on the substrate, and an overlapping area between the orthographic projection of the first electrode plate on the substrate and the orthographic projection of the second electrode plates on the substrate is greater than or equal to a predetermined area, so that a capacitance value of the second node control capacitor is greater than or equal to the predetermined capacitance value.

15. The display substrate according to claim 8, wherein the driving circuit comprises a second node control capacitor; the second node control capacitor includes a first electrode plate and a second electrode plate arranged at different layers; the first electrode plate and the second electrode plate are provided with an insulating layer;
  an orthographic projection of the first electrode plate on the substrate at least partially overlaps an orthographic projection of the second electrode plate on the substrate, and an overlapping area between the orthographic projection of the first electrode plate on the substrate and the orthographic projection of the second electrode plates on the substrate is greater than or equal to a predetermined area, so that a capacitance value of the second node control capacitor is greater than or equal to the predetermined capacitance value.

16. A display device comprising the display substrate of claim 8.

17. The display device according to claim 4, further comprising a voltage supply circuit; the first voltage signal is a low voltage signal, and a second voltage signal is a high voltage signal;
  the voltage providing circuit is configured to provide the first voltage signal and the second voltage signal, and control a difference value between a second voltage value and a first voltage value to be greater than a predetermined difference value;
  the second voltage value is a voltage value of the second voltage signal, and the first voltage value is a voltage value of the first voltage signal;
  when a potential of a clock signal provided by each clock signal line included in the driving circuit in the display substrate is a low voltage, a voltage value of the clock signal is the first voltage value;
  when the potential of the clock signal provided by each clock signal line is a high voltage, the voltage value of the clock signal is the second voltage value.

* * * * *